(12) United States Patent
Wang et al.

(10) Patent No.: US 9,285,431 B2
(45) Date of Patent: Mar. 15, 2016

(54) METHOD FOR MONITORING AND MANAGING BATTERY CHARGE LEVEL AND APPARATUS FOR PERFORMING THE SAME

(71) Applicants: Qing Wang, Shenzhen (CN); Zhanghu Luo, Shenzhen (CN); Zefeng Huang, Shenzhen (CN); Haoran Guo, Shenzhen (CN); Quanhao Xiao, Shenzhen (CN); Yixia Yuan, Shenzhen (CN); Jiashun Song, Shenzhen (CN); Pengtao Li, Shenzhen (CN); Yunfeng Dai, Shenzhen (CN); Xunchang Zhan, Shenzhen (CN); Chunyou Lin, Shenzhen (CN)

(72) Inventors: Qing Wang, Shenzhen (CN); Zhanghu Luo, Shenzhen (CN); Zefeng Huang, Shenzhen (CN); Haoran Guo, Shenzhen (CN); Quanhao Xiao, Shenzhen (CN); Yixia Yuan, Shenzhen (CN); Jiashun Song, Shenzhen (CN); Pengtao Li, Shenzhen (CN); Yunfeng Dai, Shenzhen (CN); Xunchang Zhan, Shenzhen (CN); Chunyou Lin, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 0 days.

(21) Appl. No.: 14/394,077

(22) PCT Filed: Apr. 8, 2013

(86) PCT No.: PCT/CN2013/073889
  § 371 (c)(1),
  (2) Date: Oct. 10, 2014

(87) PCT Pub. No.: WO2013/163916
  PCT Pub. Date: Nov. 7, 2013

(65) Prior Publication Data
  US 2015/0077126 A1  Mar. 19, 2015

(30) Foreign Application Priority Data

Apr. 10, 2012 (CN) .......................... 2012 1 0102698
  Apr. 25, 2012 (CN) .......................... 2012 1 0123798

(51) Int. Cl.
  *G01N 27/416* (2006.01)
  *G01R 31/36* (2006.01)
  (Continued)

(52) U.S. Cl.
  CPC ........ *G01R 31/3606* (2013.01); *G01R 31/3682* (2013.01); *H01M 10/44* (2013.01); *H01M 10/48* (2013.01); *H02J 7/00* (2013.01); *H01M 2010/4271* (2013.01)

(58) Field of Classification Search
  USPC .......................................................... 324/428
  See application file for complete search history.

(56) References Cited

U.S. PATENT DOCUMENTS 6,903,778 B1  6/2005  Kaku
7,528,577 B2 *  5/2009  Hara et al. ..................... 320/132

(Continued)

FOREIGN PATENT DOCUMENTS

CN     101222713     7/2008
CN     101364740     2/2009

(Continued)

OTHER PUBLICATIONS

International Search Report and Written Opinion for International Application No. PCT/CN2013/073889, mailed Jul. 18, 2013.

(Continued)

*Primary Examiner* — Robert Grant
(74) *Attorney, Agent, or Firm* — Blakely, Sokoloff, Taylor & Zafman

(57) ABSTRACT

A method for monitoring and managing battery charge level and an apparatus for performing the same, wherein the method comprises steps as follows: A current charge level of a battery equipped in the electrical apparatus is acquired. A coefficient of current battery power consumption is directed in accordance with a user.

16 Claims, 9 Drawing Sheets

(51) Int. Cl.
  *H01M 10/44* (2006.01)
  *H01M 10/48* (2006.01)
  *H02J 7/00* (2006.01)
  *H01M 10/42* (2006.01)

(56) References Cited

U.S. PATENT DOCUMENTS

| 2008/0057894 A1* | 3/2008 | Aleksic et al. ............ 455/187.1 |
| 2009/0164152 A1 | 6/2009 | Creus et al. |
| 2009/0177422 A1 | 7/2009 | Cox et al. |

FOREIGN PATENT DOCUMENTS

| CN | 101388924 | 3/2009 |
| CN | 201444589 | 4/2010 |
| CN | 101727163 | 6/2010 |
| CN | 101903845 | 12/2010 |
| CN | 101910975 | 12/2010 |
| CN | 101995554 | 3/2011 |
| CN | 102073016 | 5/2011 |
| CN | 102096459 | 6/2011 |
| CN | 102156530 | 8/2011 |
| CN | 102193615 | 9/2011 |
| CN | 202135331 | 2/2012 |
| JP | 2002262168 | 9/2012 |

OTHER PUBLICATIONS

First Office Action and Search Report for Chinese Patent Application No. 201210102698.9, mailed Jul. 31, 2014.
First Office Action and Search Report for Chinese Patent Application No. 201210123798.X, mailed Dec. 15, 2014.

* cited by examiner

METHOD FOR MONITORING AND MANAGING BATTERY CHARGE LEVEL AND APPARATUS FOR PERFORMING THE SAME

CROSS-REFERENCE TO RELATED APPLICATIONS

This application is the U.S. National Phase of International Application No. PCT/CN2013/073889, filed Apr. 8, 2013, and priority of Chinese Patent Application No. 201210102698.9, filed Apr. 10, 2012, and Chinese Patent Application No. 201210123798.X, filed Apr. 25, 2012, the disclosures of all of which are incorporated herein by reference in their entireties.

FIELD OF THE INVENTION

The present invention relates to a battery, and more particularly to a method for monitoring and managing battery charge level and an apparatus for performing the method.

BACKGROUND OF THE INVENTION

An electrical apparatus is typically equipped with a battery for supplying electric power in order to secure its normal operation while there is no external power supply connected to the electrical apparatus. In addition, batteries can make life more convenient or make work easier by way of allowing a user of a portable electrical apparatus, such as a cell phone, a notebook computer, a plane computer or a personal digital assistant (PDA) to take his/her portable electrical apparatus moving around freely without the hindrance of an external power supply connected therewith.

However, the power supply can be terminated when charge of the batteries is exhausted, and interruption and inconvenience may occur. For example, it would be an unpleasant experience to a cell phone user, when the conversation is broken by the termination of power supply due to the battery exhaust.

To solve the problem, the charge level of a battery equipped in a portable electrical apparatus is monitored and the remaining charge level is graphically displayed by an icon to remind the user connecting an external power supply to the portable electrical apparatus on time in order to secure its normal operation.

However, the icon merely reveals a rough estimate of how much time remains before the battery is exhausted, the user can not determine the exact value of the remaining time and when he/she should connect the external power supply to the portable electrical apparatus before the battery exhausted.

At the present time, the portable electrical apparatus is usually equipped with lithium (Li) batteries (also referred as Li-ion polymer battery) that are rechargeable and has higher power density, lighter weight and longer lifetime in comparison with nickel (Ni) batteries.

In order to extend the available time of the portable electrical apparatus or the battery life, a battery management method is recently adopted. Several battery power modes, such as normal operation mode and power saving mode, are provided by the application programs established in the portable electrical apparatus. The user can select one of the battery power modes in accordance with the current operating status of the portable electrical apparatus, as a result the power usage effectiveness of the battery can be improved, and the available time of the portable electrical apparatus or the battery life can be also prolonged.

However, there are still problems to extending the available time of the portable electrical apparatus or the battery life. On one hand, since the users should select the battery power modes by themselves, but most of the users are not capable to select the proper mode to use power more effectively, thus the available time of the portable electrical apparatus or the battery life can not be extended by above approaches. On the other hand, improper battery power mode may cause a poor performance of the portable electrical apparatus. For example, when a high energy consuming application program, such as a game application, is performed on a portable electrical apparatus, but the operation status of the portable electrical apparatus is still set in the power saving mode, while the center process unit (CPU) of the portable electrical apparatus may run in a reduced frequency, image lag may thus occur and the performance of the portable electrical apparatus is deteriorated. In some other case, when the battery charge level (of a Li battery) is depleted to a predetermined level, and the portable electrical apparatus is still put in a normal operation mode, the charge of the battery may be exhausted sooner than expected, so as to cause the portable electrical apparatus shutdown unexpectedly. Besides a large current drain in a short time may cause the battery available capacity and longevity decreased significantly.

Therefore, there is a need of providing an improved a method for monitoring and managing battery charge level and an apparatus for performing the same to obviate the drawbacks encountered from the prior art.

SUMMARY OF THE INVENTION

In accordance with an aspect, the present invention provides a method for monitoring and managing battery charge level, wherein the method comprising steps as follows:

A current charge level of a battery equipped in the electrical apparatus is acquired. A coefficient of current battery power consumption is then directed in accordance with a user's operation habit concluded from a power consumption history of the battery. Subsequently, a battery remaining time of the battery is estimated in accordance with the current charge level of the battery and the coefficient of current battery power consumption under the current operating status of the electrical apparatus. The user can be readily aware of the remaining time of the battery, thus the external power supply can be connected to the electrical apparatus on time to secure its normal operation, so as to prevent the user from losing important information due to the termination of power supply.

In one embodiment of the present invention, the process for acquiring the current charge level comprises a step of applying an application programming interface (API) corresponding to the battery to acquire the current charge level of the battery.

In one embodiment of the present invention, the process for directing the coefficient of current battery power consumption comprises a step of retrieving the coefficient of current battery power consumption from a database showing a correlation between a predetermined operation habit and its corresponding coefficient in power consumption in accordance with the current user's operation habit.

In one embodiment of the present invention, the process for estimating the battery remaining time comprises steps as follows:

A current battery available capacity is firstly estimated in accordance with the current charge level of the battery and the coefficient of current battery power consumption. Next, a current operating status of the electrical apparatus at least including an idle state, a phone call state, an internet connection state or a text display state is acquired. Subsequently, a current battery power consumption that indicates the mount of battery power consumed by the electrical apparatus in a certain operating interval under the current operating status is acquired. And the current battery remaining time is then estimated in accordance with the current battery available capacity and the current battery power consumption under a certain operating status of the electrical apparatus.

In one embodiment of the present invention, the process for acquiring the current operating status of the electrical apparatus comprises a step of applying a predetermined call state interface to acquire the current operating status of the electrical apparatus.

In one embodiment of the present invention, the process for acquiring the current battery power consumption comprises a step of retrieving the current battery power consumption comprise from a database showing a correlation between a predetermined operating status and its corresponding battery power consumption in accordance with the current operating status.

In one embodiment of the present invention, the method further comprises steps of determining whether the current battery available capacity is greater than a first predetermined threshold value; shifting the current operation status into a normal operation mode, if the current battery available capacity is greater than the first predetermined threshold value; and shifting the current operation status into a power saving mode that includes keeping at least one hardware in idle state, making at least one program unable to work, keeping at least one hardware at a low performance state or a combination thereof, if the current battery available capacity is not greater than the first predetermined threshold value.

In accordance with another aspect, the present invention provides an apparatus for performing the method for monitoring and managing battery charge level, wherein the apparatus comprises a first information acquiring module, a monitoring module, a second information acquiring module, and a calculating module. The first information acquiring module is used to acquire a current charge level of a battery equipped in an electrical apparatus. The monitoring module is used to monitoring a power consumption history of the battery, so as to conclude a user's operation habit at least comprising historical information about battery discharge frequency or time interval of battery discharge. The second information acquiring module is used to direct a coefficient of current battery power consumption in accordance with the user's operation habit. The calculating module is used to calculate a battery remaining time of the battery in accordance with the current charge level and the coefficient of current battery power consumption under the current operating status of the electrical apparatus.

In one embodiment of the present invention, the first information acquiring module is used to apply an API corresponding to the battery to acquire the current charge level of the battery.

In one embodiment of the present invention, the second information acquiring module is used to direct the coefficient of current battery power consumption by retrieving a database showing a correlation between a predetermined operation habit and its corresponding coefficient in power consumption in accordance with the user's operation habit.

In one embodiment of the present invention, the calculating module comprises a first calculating unit, a first information acquiring unit, a second information acquiring unit and a second calculating unit. The first calculating unit is used to estimate a current battery available capacity in accordance with the current charge level of the battery and the coefficient of current battery power consumption. The first information acquiring unit is used to acquire a current operating status of the electrical apparatus including an idle state, a phone call state, an internet connection state or a text display state. The second information acquiring unit is used to acquire a current battery power consumption indicating the mount of battery power consumed by the electrical apparatus in a certain operating interval under the current operating status. The second calculating unit is used to estimate a current battery remaining time in accordance with the current battery available capacity and the current battery power consumption.

In one embodiment of the present invention, the first information acquiring module is used to apply a predetermined call state interface to acquire the current operating status of the electrical apparatus.

In one embodiment of the present invention, the second information acquiring unit is used to retrieve the current battery power consumption from a database showing a correlation between a predetermined operating status and its corresponding battery power consumption in accordance with the current operating status of the electrical apparatus in order to acquire the current battery power consumption.

In one embodiment of the present invention, the apparatus further comprises a battery determining module and a mode setting module. The battery determining module is used to determine whether the current battery available capacity is greater than a first predetermined threshold value. The mode setting module is used to shift the current operation status into a normal operation mode, while the current battery available capacity is greater than the first predetermined threshold value, and used to shift the current operation status into a power saving mode including of keeping at least one hardware in idle state, making at least one programs unable to work, keeping at least one hardware at a low performance state or a combination thereof, while the current battery available capacity is not greater than the first predetermined threshold value.

In accordance with further aspect, the present invention provides a battery managing method, wherein the method comprises steps as follows:

A process for determining whether a current battery available capacity of a battery equipped in an electrical apparatus is greater than a first predetermined threshold value is firstly performed.

A current operation status of the electrical apparatus is shifted into a normal operation mode, if the current battery available capacity is greater than the first predetermined threshold value; otherwise the current operation status is shifted into a power saving mode that includes keeping at least one hardware in idle state, making at least one program unable, keeping at least one hardware at a low performance state or a combination thereof, if the current battery available capacity is not greater than the first predetermined threshold value.

In one embodiment of the present invention, before the process for determining whether the current battery available capacity is greater than the first predetermined threshold value, the method further comprises steps of classifying at least one predetermined hardware or program of the electrical apparatus into an essential category and an optional category, whereby when the current operation status is shifted into the power saving mode, the predetermined hardware that is classified in the optional category can be kept in idle state; and the predetermined program that is classified in the optional category can be set as unable.

In one embodiment of the present invention, before the process for determining whether the current battery available capacity is greater than the first predetermined threshold value, the method further comprising steps of saving a system default value to allow a predetermined hardware of the electrical apparatus running either in a first function mode or a second function mode, wherein the first function mode has a performance lower than that of the second function mode. Thus when the current operation status is shifted into the power saving mode, the predetermined hardware can run in the first function mode.

In one embodiment of the present invention, the method further comprises steps as follows: A process for determining whether the current battery available capacity reaches to the second predetermined threshold value is performed; and a first reminder information is then revealed when the current battery available capacity reaches to the second predetermined threshold value, wherein the second predetermined threshold value is indicated as a percentage value ranging from 80% to 100%.

In one embodiment of the present invention, the method further comprises steps as follows: A process for determining whether a time period calculated from a last trickle charge process is carried out is greater than a third predetermined threshold value; and a first reminder information is then revealed, when the time period is greater than the third predetermined threshold value.

In accordance with further aspect, the present invention provides a battery managing apparatus, wherein the apparatus comprises a battery determining module and a mode setting module. The battery determining module is used to determine whether a current battery available capacity of a battery equipped in an electrical apparatus is greater than a first predetermined threshold value. The mode setting module is used to either shift a current operation status of the electrical apparatus into a normal operation mode, while the current battery available capacity is greater than the first predetermined threshold value; or shift the current operation status into a power saving mode that includes keeping at least one hardware in idle state, making at least one programs unable to work, keeping at least one hardware at a low performance state or a combination thereof, while the current battery available capacity is not greater than the first predetermined threshold value.

In one embodiment of the present invention, the apparatus further comprises a classifying module used to classify at least one predetermined hardware or program into an essential category and an optional category, when the current operation status is shifted into a power saving mode the predetermined hardware that is classified in the optional category can be kept in idle state, and the predetermined program that is classified in the optional category can be set as unable to work.

In one embodiment of the present invention, the apparatus further comprises a mode saving module used to save a system default value allowing a predetermined hardware of the electrical apparatus either running in a first function mode or running in a second function mode, wherein the first function mode has a performance lower than that of the second function mode; when the current operation status is shifted into the power saving mode, the predetermined hardware can run in the first function mode.

In one embodiment of the present invention, the apparatus further comprises a full charge reminder module used to provide a first reminder information, when the battery determining module determines that the current battery available capacity reaches to the second predetermined threshold value, wherein the second predetermined threshold value is indicated as a percentage value ranging from 80% to 100%.

In one embodiment of the present invention, the apparatus further comprises a battery maintain reminder module used to provide a second reminder information, when a time period calculated from a last trickle charge process is carried out is greater than a third predetermined threshold value.

In accordance with the aforementioned embodiments, the benefit provided by the present embodiment cane be achieved by acquiring a current charge level of a battery equipped in the electrical apparatus; directing a coefficient of current battery power consumption in accordance with a user's operation habit concluded from a power consumptions history of the battery; and estimating a battery remaining time of the battery in accordance with the current charge level of the battery and the coefficient of current battery power consumption under the current operating status of the electrical apparatus. As a result, the user can be readily aware of the remaining time of the battery in a certain operating status of the electrical apparatus, thus the external power supply can be connected to the electrical apparatus in time, so as to secure its normal operation and prevent the user from losing important information due to the termination of power supply.

In addition, the method and apparatus provided by the aforementioned embodiments can shifting the operation status of a electrical apparatus to make the battery equipped by the electrical apparatus comply with the nature characteristic of the material consisting of the battery, thus the available time of the electrical apparatus and the lifetime of the battery may be significantly prolonged. Furthermore, when the battery is full charge or a battery maintain is need reminder information may be provided to remind the user stopping charging the battery or proceeding a trickle charging process, so as to protect the battery from being overcharged and enable the battery remaining at its fully charged level. Therefore, the lifetime of the battery could be further prolonged.

BRIEF DESCRIPTION OF THE DRAWINGS

The above objects and advantages of the present invention will become more readily apparent to those ordinarily skilled in the art after reviewing the following detailed descriptions and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Embodiment I

Figure 1:
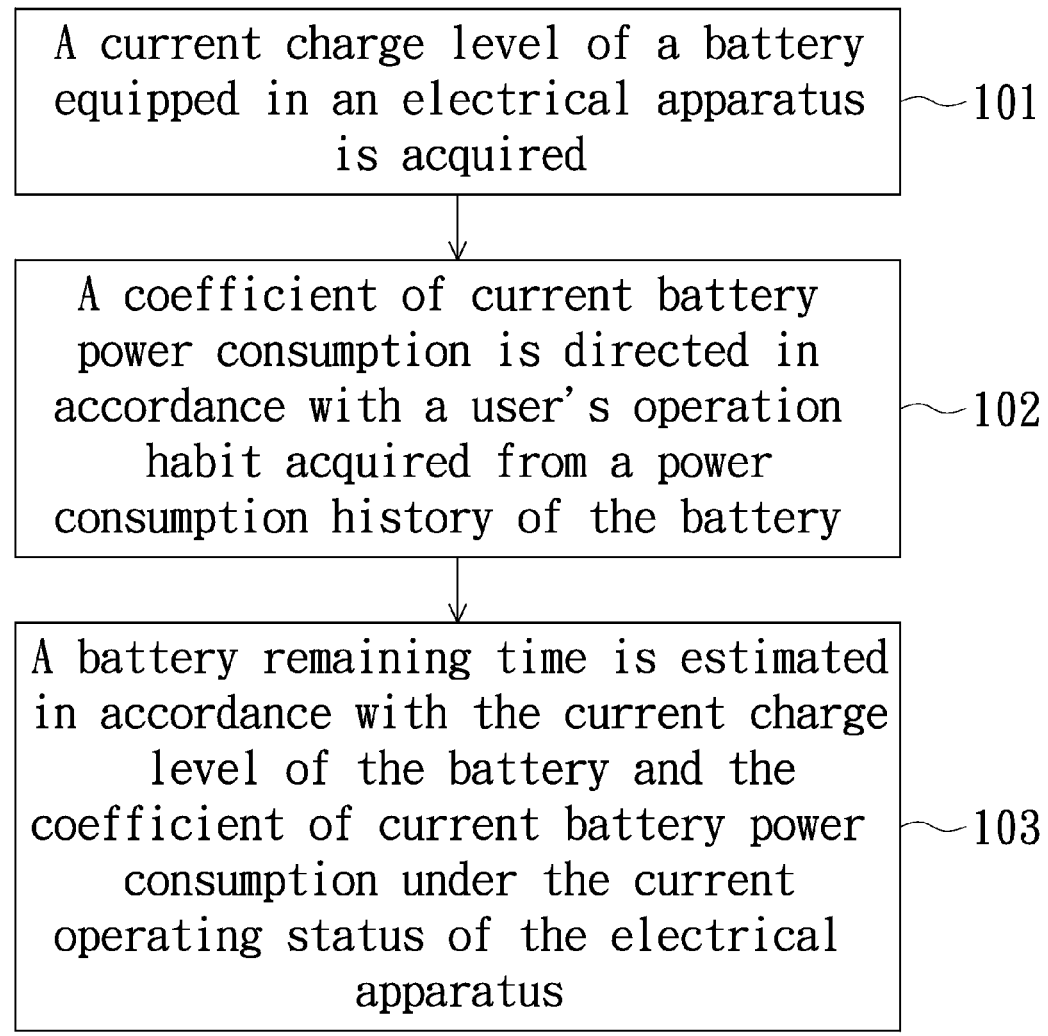
FIG. 1 is a block diagram illustrating a method for monitoring battery charge level of a battery equipped in an electrical apparatus in accordance with one embodiment of the present invention.

FIG. 1 is a block diagram illustrating a method for monitoring battery charge level of a battery equipped in an electrical apparatus in accordance with one embodiment of the present invention, wherein the method comprises steps as follows:

Firstly refer to Step 101, a current charge level of the battery equipped in the electrical apparatus is acquired.

Refer to Step 102, a coefficient of current battery power consumption is directed in accordance with a user's operation habit acquired from a power consumption history of the battery obtained by monitoring the operation of the electrical apparatus wherein the user's operation habit at least comprises information about the frequency of the battery discharge and/or and the time interval of the battery discharge.

Refer to Step 103, a battery remaining time is estimated in accordance with the current charge level of the battery and the coefficient of current battery power consumption under the current operating status of the electrical apparatus.

The benefit provided by the present embodiment can be achieved by acquiring a current charge level of a battery equipped in the electrical apparatus; directing a coefficient of current battery power consumption in accordance with a user's operation habit concluded from a power consumption history of the battery; and estimating a battery remaining time of the battery in accordance with the current charge level of the battery and the coefficient of current battery power consumption under the current operating status of the electrical apparatus. As a result, the user can be readily aware of the remaining time of the battery in a certain operating status of the electrical apparatus, thus the external power supply can be connected to the electrical apparatus on time, so as to secure its normal operation and prevent the user from losing important information due to the termination of power supply.

Embodiment II

Figure 2:
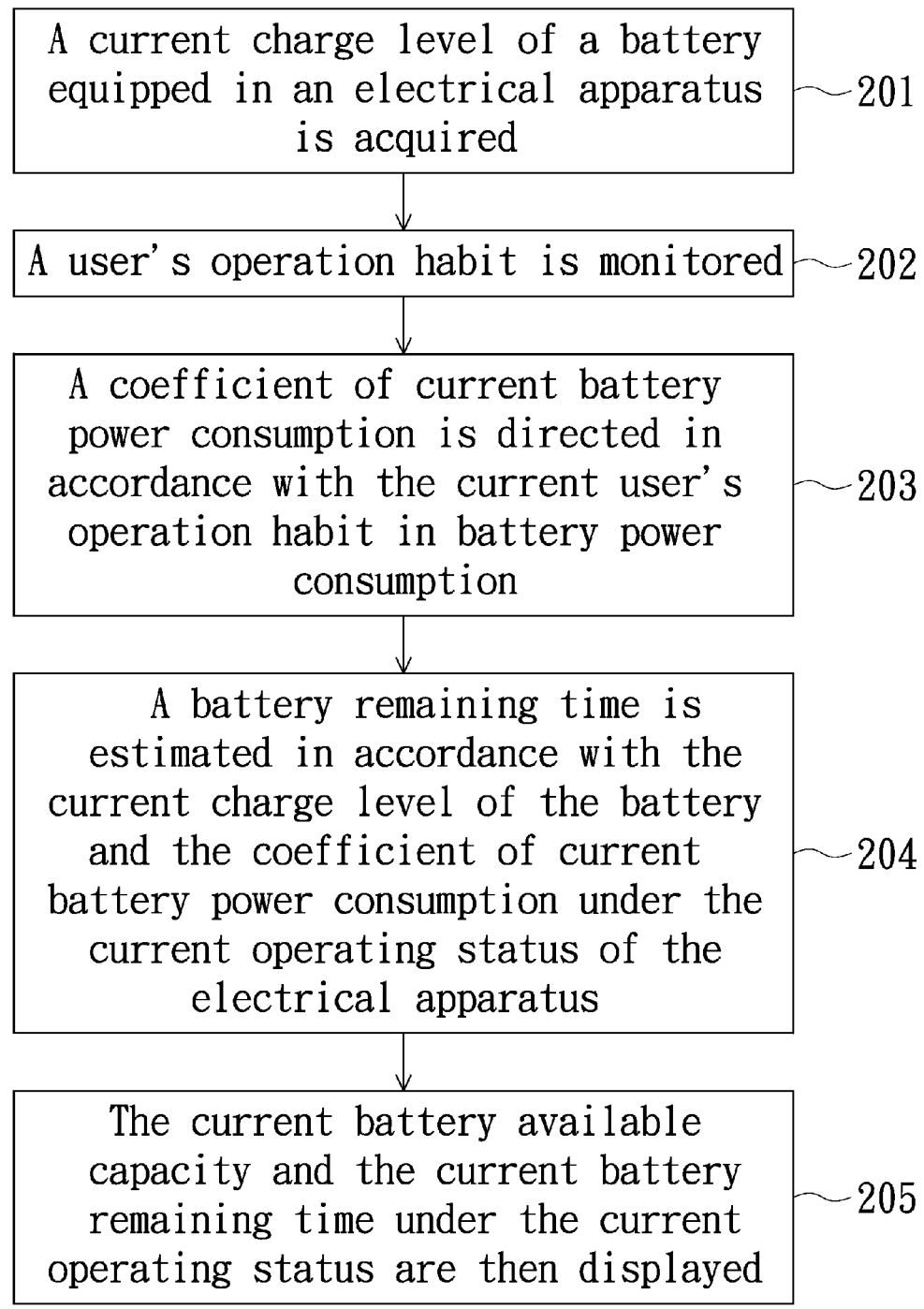
FIG. 2 is a block diagram illustrating a method for monitoring battery charge level of a battery equipped in an electrical apparatus in accordance with another embodiment of the present invention.

FIG. 2 is a block diagram illustrating a method for monitoring battery charge level of a battery equipped in an electrical apparatus in accordance with another embodiment of the present invention. In the present embodiment, a method for monitoring battery charge level of a battery equipped in an electrical apparatus is provided, wherein the method is implemented by an electrical apparatus equipped with the battery. In the present embodiment, the electrical apparatus may be a cell phone, a notebook computer, a plane computer or a PDA. The method for monitoring battery charge level of the battery equipped in the electrical apparatus comprises steps as follows:

Firstly refer to Step 201, a current charge level of the battery equipped in the electrical apparatus is acquired, wherein the current charge level is the energy density or current capacity of the battery, typically in units of milliampere-hours (mAh).

Practically, an application programming interface (API) corresponding to the battery equipped in the electrical apparatus is applied to acquire the current charge level of the battery.

In the present embodiment, a real-time monitoring is performed to measure and record the real-time charge level and power consumption of the battery. When the information of the current charge level of the battery is requested, the API corresponding to the battery is applied to access the real-time charge level record to acquire the current charge level of the battery. Alternatively, the API corresponding to the battery may be called to measure the current charge level of the battery promptly, while the information of the current charge level of the battery is requested.

Refer to Step 202, a user's operation habit at least comprising historical information about battery discharge frequency and/or and time interval of the battery discharge is monitored.

In an optional embodiment, while the electrical apparatus is initiated, a user may be required to key in the information about a user's operation habit in battery power consumption (thereinafter referred as the user's operation habit) by a default request. The initial user's operation habit may be updated in accordance with the operation history resulted from a real-time monitoring. When the current information about the user's operation habit is requested, the API is called to access the updated user's operation habit to acquire the current information about the user's operation habit.

Refer to Step 203, a coefficient of current battery power consumption is directed in accordance with the current user's operation habit in battery power consumption. In practice, the coefficient of current battery power consumption can be retrieved from a database showing the correlation between a predetermined operation habit and its corresponding coefficient in power consumption established in accordance with the current user's operation habit.

In the embodiments of the present invention, maximum charging capacity of a battery may diminish over time due to the variation of the user's operation habit in power consumption. In the present embodiment, the coefficient of current battery power consumption may be used to indicate the degradation ratio of the maximum battery charging capacity after the battery is operated for a certain time under a predetermined operation habit. For example, as the initial maximum battery charging capacity of a new made battery is about 4400 mAh; the maximum battery charging capacity may diminish to 4200 mAh after 6 month of repeated changing and discharging under a predetermined operation mode (operation habit); and the coefficient of current battery power consumption can be calculated by the following equation:

$$(4400-4200)/4400 = 4.5\%$$

which means that, the maximum battery charging capacity diminishes about 4.5% after 6 month of use under the predetermined operation habit in battery power consumption.

In some practical embodiments, a database showing the correlation between a predetermined operation habit and its corresponding coefficient in power consumption is established by concluding the results of a lot of experiments in battery power consumption based on the nature characteristics of a newly made battery including the power charging capacity of different material consisting of the battery.

For example, a lot of experiments in Li battery power consumption are performed and the results are statistically analyzed to calculate various degradation ratios of the battery maximum charging capacity at different operation time under a predetermined operation habit. The correlations of the degradation ratios of the maximum battery charging capacity and the operation times are then concluded into a table illustrated as Table 1:

TABLE 1

| Battery Type | Operation Time | Degradation Ratios of the Maximum Battery Charging Capacity |
|---|---|---|
| Li Battery | 1 month | 0.1% |
| | 2 month | 0.3% |
| | 3 month | 0.7% |
| | 4 month | 1% |
| | ... | ... |

In the present embodiment, a database including the correlation of the degradation ratio of the maximum battery charging capacity and the operation times under different predetermined operation habit are further established and saved in the electrical apparatus. Accordingly, the current degradation ratios of the maximum battery charging capacity can be obtained promptly by retrieving the database including the correlation between various predetermined operation habits in power consumption and its corresponding degradation ratios of the maximum battery charging capacity in accordance with the current user's operation habit.

Refer to Step 204, a battery remaining time is estimated in accordance with the current charge level of the battery and the degradation ratios of the maximum battery charging capacity under the current operating status of the electrical apparatus.

The practical steps for implementing the present embodiment are described as follows:

A current battery available capacity is estimated in accordance with the current charge level of the battery and the degradation ratios of the battery maximum charging capacity. In practice, the current battery available capacity can be obtained by calculating the difference between the current charge level and a product of the current charge level and the degradation ratios of the maximum battery charging capacity (which is referred as the charging capacity degradation).

In sum, because the initial maximum battery charging capacity of a newly made battery could diminish over time and the ratio of the charging capacity degradation may vary by different user's operation habit in battery power consumption. Thus the current charge level acquired by the API that is estimated base on the initial maximum battery charging capacity could not accurately reflect the current battery available capacity without consider the battery charging capacity degradation. Such that, it is necessary to subtract the charging capacity degradation from the current charge level in order to accurately estimate the current battery available capacity.

Subsequently, a current operating status of the electrical apparatus is acquired. In the present embodiment, the current operating status at least comprises the information for indicating the electrical apparatus is running at an idle state, a phone call state, an internet connection state or a text display state.

In some embodiments of the present invention, a predetermined call state interface can be applied to acquire the current operating status of the electrical apparatus, wherein the call state interface is an API comprising a command of Call.State state=mCM.getActiveFgCall( ).getState( ); and the state describing the current progress of the electrical apparatus can be obtained via the description of getState( ).

A current battery power consumption indicating the mount of battery power consumed by the electrical apparatus in a certain operating interval under the current operating status is then acquired. For example, in the present embodiment, the current battery power consumption is about 10 mAh/s. It means that the electrical apparatus consumes battery power of 10 mAh every second under the current operating status.

In the present embodiment, the current battery power consumption can be acquired by searching a correlation table showing the correlation between a predetermined operating status and its corresponding battery power consumption in accordance with the previously obtained current operating status.

In practice, a lot of experiments based on the nature characteristics of a battery including the power charging capacity of different material consisting of the battery are repeatedly performed and the experiment results are statistically analyzed to calculate various battery power consumptions under different operating status, so as to establish the correlation table showing the correlation between a certain corresponding operating status and its corresponding battery power consumption, and the correlation table is store in the electrical apparatus. Accordingly, the current battery power consumption under a certain operating status can be acquired by directly referencing to the correlation table. The correlation table showing the correlation between a predetermined operating status and its corresponding battery power consumption is illustrated as Table 2:

TABLE 2

| Operating Status | Battery Power Consumption (mAh/min) |
|---|---|
| Idle Stae | 0.5 mA/m |
| phone call state, or | 50 mA/m |
| internet connection state | 100 mA/m |
| text display state | 30 mA/m |
| ... | ... |

The current battery remaining time is estimated in accordance with the current battery available capacity and the current battery power consumption under a certain operating status of the electrical apparatus. Specifically, the current battery remaining time under the current operating status equals to the quotient of the current battery available capacity divided by the current battery power consumption.

Refer to Step 205, the current battery available capacity and the current battery remaining time under the current operating status are then displayed to remind the user connecting the electrical apparatus with an external power supply on time in order to secure the normal operation of the portable electrical apparatus or make a timely backup to prevent important information from being eliminated due to a sudden termination of power supply.

The benefit provided by the present embodiment cane be achieved by acquiring a current charge level of a battery equipped in the electrical apparatus; directing a coefficient of current battery power consumption in accordance with a user's operation habit concluded from a power consumptions history of the battery; and estimating a battery remaining time of the battery in accordance with the current charge level of the battery and the coefficient of current battery power consumption under the current operating status of the electrical apparatus. As a result, the user can be readily aware of the remaining time of the battery in a certain operating status of the electrical apparatus, thus the external power supply can be connected to the electrical apparatus in time, so as to secure its normal operation and prevent the user from losing important information due to the termination of power supply.

Embodiment III

Figure 3:
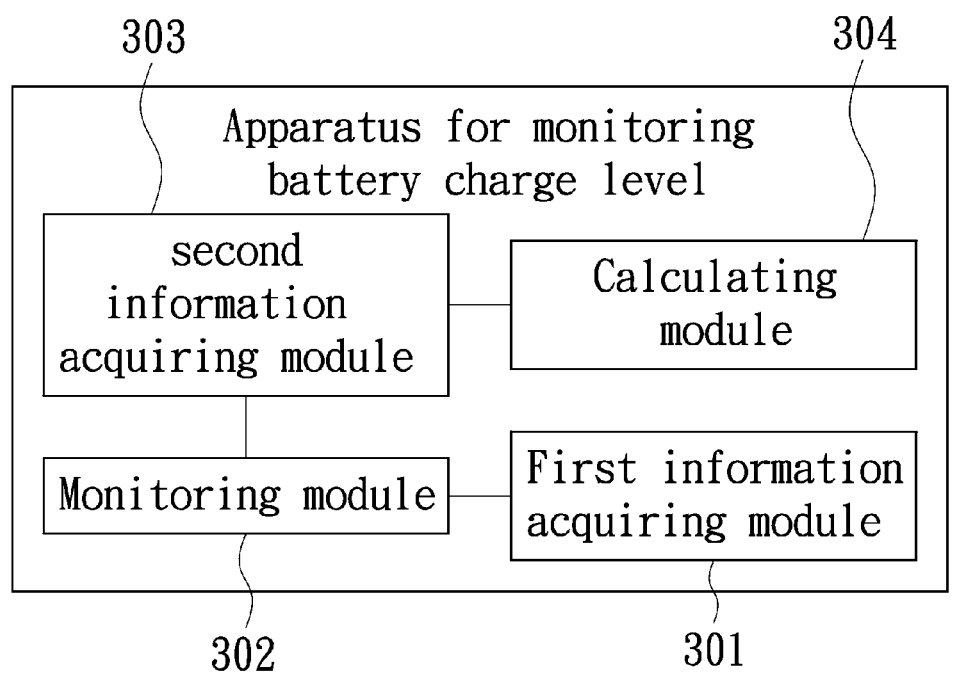
FIG. 3 is a block diagram illustrating an apparatus for monitoring battery charge level in accordance with further embodiment of the present invention.

FIG. 3 is a block diagram illustrating an apparatus for monitoring battery charge level in accordance with further embodiment of the present invention. Wherein the apparatus for monitoring battery charge level comprises a first information acquiring module 301, a monitoring module 302, a second information acquiring module 303 and a calculating module 304.

The first information acquiring module 301 is used to acquire a current charge level of a battery equipped in the electrical apparatus.

The monitoring module 302 is used to monitoring the power consumption history of the battery, so as to conclude a user's operation habit at least comprising information about battery discharge frequency and/or and time interval of battery discharge.

The second information acquiring module 303 is used to direct a coefficient of current battery power consumption in accordance with the user's operation habit.

The calculating module 304 is used to calculate a battery remaining time of the battery in accordance with the current charge level and the coefficient of current battery power consumption under the current operating status of the electrical apparatus.

In practice, the first information acquiring module 301 is used to call an API corresponding to the battery for acquiring the current charge level of the battery.

In practice, the monitoring module 304 is used to retrieve a database showing the correlation between a predetermined operation habit and its corresponding coefficient in power consumption to direct a coefficient of current battery power consumption.

Figure 4:
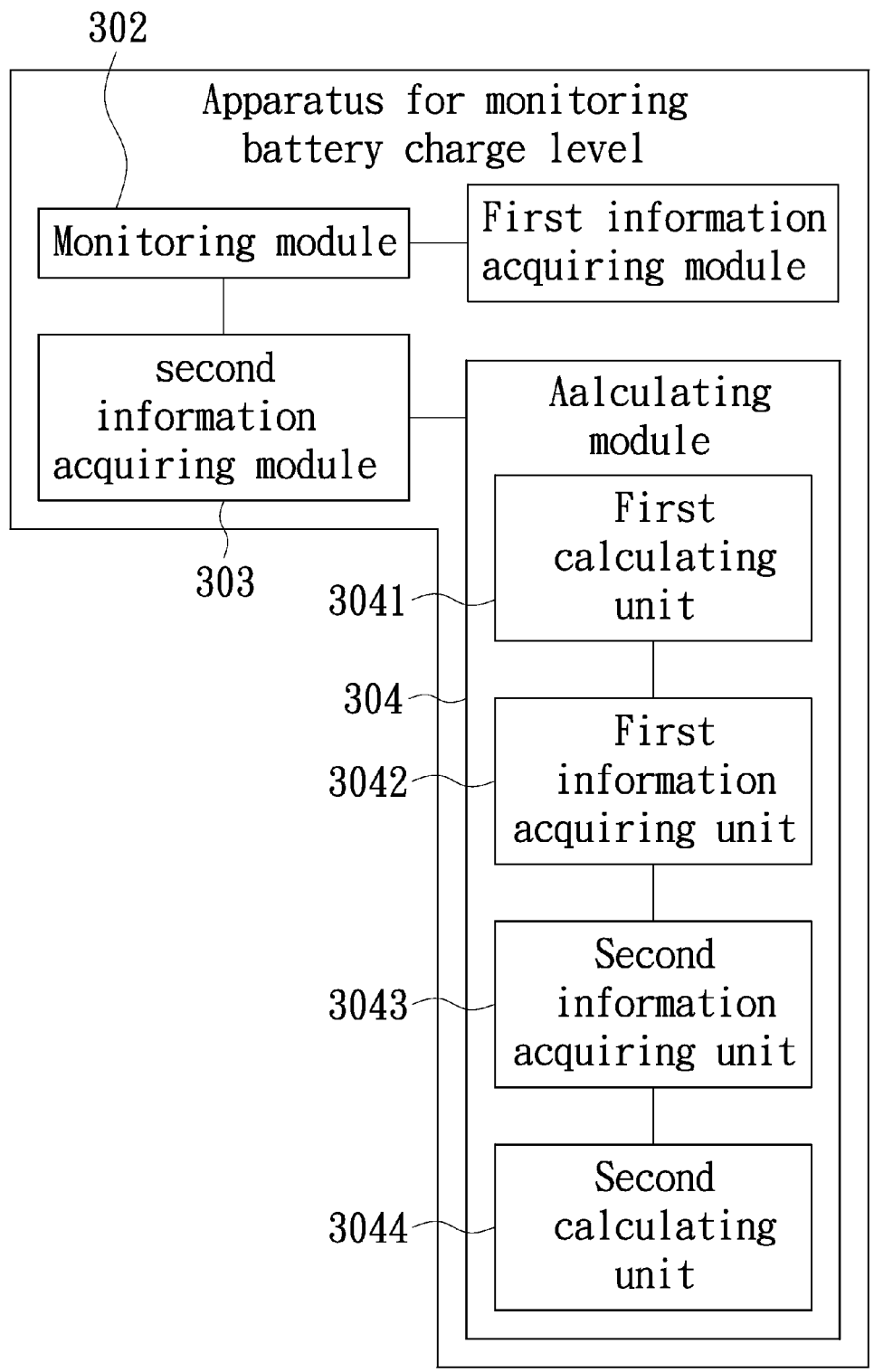
FIG. 4 is a block diagram illustrating the detailed components of the calculating module 304 depicted in FIG. 3.

FIG. 4 is a block diagram illustrating the detailed components of the calculating module 304 depicted in FIG. 3, wherein the calculating module 304 comprises:

a first calculating unit 3041, used to estimate a current battery available capacity in accordance with the current charge level of the battery and the coefficient of current battery power consumption;

a first information acquiring unit 3042, used to acquire a current operating status of the electrical apparatus indicating the electrical apparatus is running at an idle state, a phone call state, an internet connection state or a text display state;

a second information acquiring unit 3043, used to acquire a current battery power consumption indicating the mount of battery power consumed by the electrical apparatus in a certain operating interval under the current operating status; and a second calculating unit 3044, used to estimate a current battery remaining time in accordance with the current battery available capacity and the current battery power consumption under the current operating status of the electrical apparatus.

In practice, the first information acquiring unit 3042 is used to call a predetermined call state interface to acquire the current operating status of the electrical apparatus.

In practice, the second information acquiring unit 3043 is used to search a correlation table showing the correlation between a predetermined operating status and its corresponding battery power consumption in accordance with the current operating status of the electrical apparatus in order to acquire the current battery power consumption.

Figure 5:
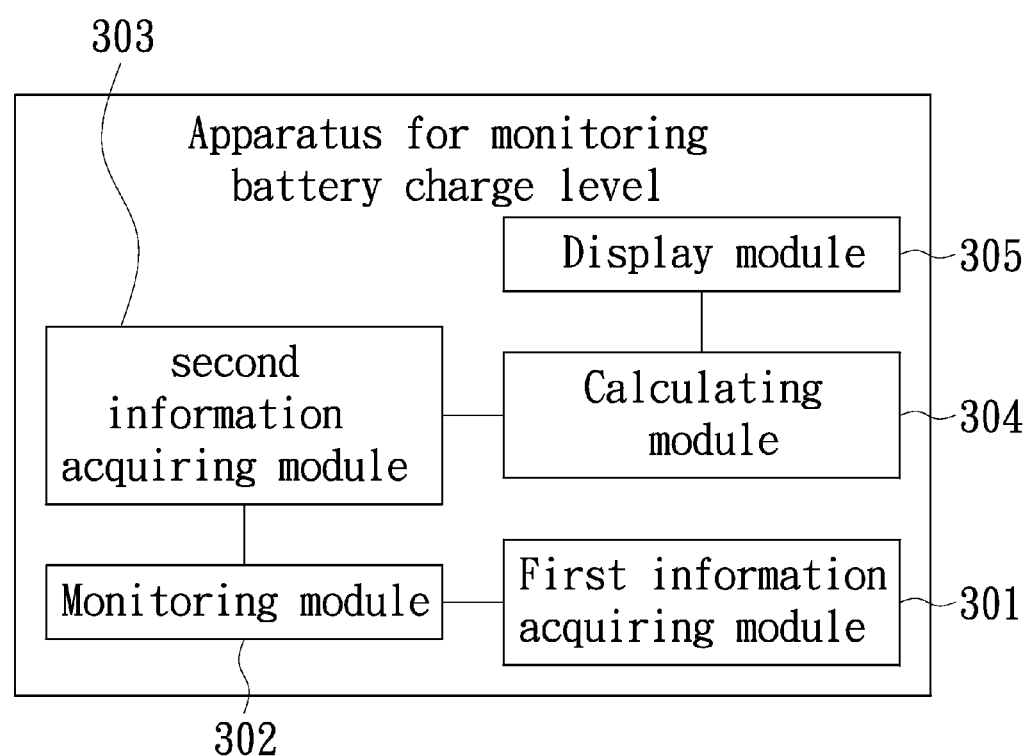
FIG. 5 is a block diagram illustrating detailed components of the electrical apparatus depicted in FIG. 3.

FIG. 5 is a block diagram illustrating detailed components of the electrical apparatus depicted in FIG. 3, wherein the electrical apparatus further comprises a display module 305 used to display the current battery available capacity and the current battery remaining time under the current operating status The benefit provided by the present embodiment cane be achieved by acquiring a current charge level of a battery equipped in the electrical apparatus; directing a coefficient of current battery power consumption in accordance with a user's operation habit concluded from a power consumptions history of the battery; and estimating a battery remaining time of the battery in accordance with the current charge level of the battery and the coefficient of current battery power consumption under the current operating status of the electrical apparatus. As a result, the user can be readily aware of the remaining time of the battery in a certain operating status of the electrical apparatus, thus the external power supply can be connected to the electrical apparatus in time, so as to secure its normal operation and prevent the user from losing important information due to the termination of power supply.

It should be appreciated that the aforementioned embodiments are presented herein just for purpose of illustration and description only. It is not intended to be exhaustive or to be limited to the precise form disclosed. Thus the modules described in the aforementioned embodiments can be rearranged and modified to achieve the same functions without deviating the spirit of the present invention. However, since these various rearranged and modifications are belong to a general spirit and inventive concept with the aforementioned embodiments, thus may not be redundantly described.

While the battery charge level is monitored by the aforementioned method, the current battery available capacity can be managed by a battery managing method.

Embodiment IV

Figure 6:
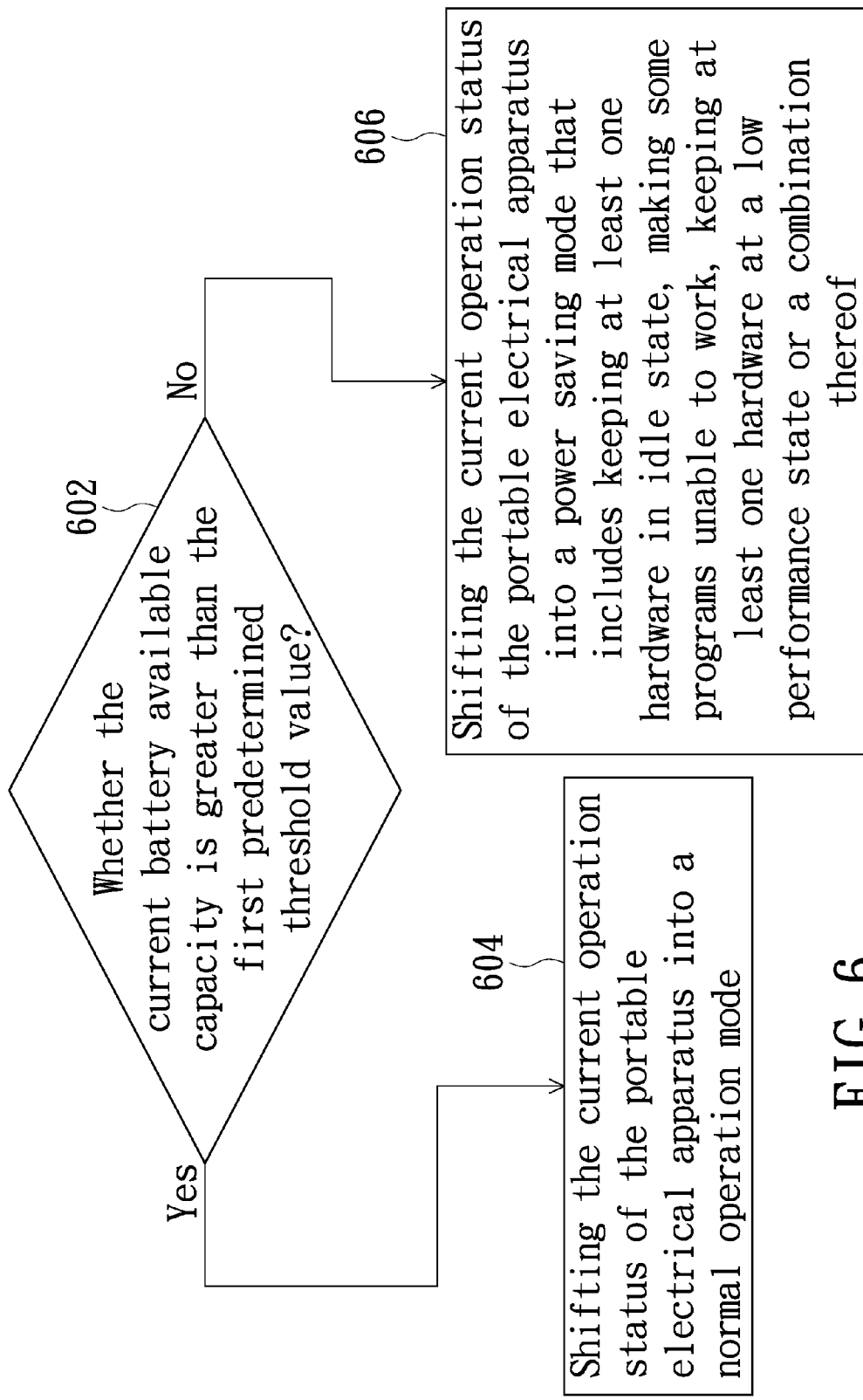
FIG. 6 is a block diagram illustrating a battery managing method in accordance with one embodiment of the present invention.

FIG. 6 is a block diagram illustrating a battery managing method in accordance with one embodiment of the present invention. The battery managing method that is available to be applied in a portable electrical apparatus, such as a cell phone, a notebook computer, a plane computer or a PDA comprises steps as follows:

Refer to Step 602, a process for determining whether the current battery available capacity is greater than the first predetermined threshold value is performed. If the answer is "Yes" the process can proceed to Step 604; and if the answer is "No" the process can otherwise proceed to Step 606.

A plurality of comparison processes of the current battery available capacity and the first predetermined threshold value may be consecutively performed in real-time by the portable electrical apparatus. Otherwise, in some other embodiment, a specific time interval may be given between two of these comparisons. In some embodiments of the present invention, the current battery available capacity may be indicted as a percentage value, and the first predetermined threshold value should be also expressed as a percentage vale, for example 20%. If the current battery available capacity acquired by the portable electrical apparatus is greater than 20%, the process can proceed to Step 604; and if the current battery available capacity acquired by the portable electrical apparatus is less than 20%, the process can otherwise proceed to Step 606.

Refer to Step 604, if the current battery available capacity acquired by the portable electrical apparatus is greater than 20%, the current operation status of the portable electrical apparatus may be automatically shifted into a normal operation mode.

When the current battery available capacity acquired by the portable electrical apparatus is greater than 20%, the current charge level of the battery is considered as plenty of power to provide the portable electrical apparatus operated in a normal operation mode under which the entire hardware and programs can be operated normally.

Refer to Step 606, if the current battery available capacity acquired by the portable electrical apparatus is less than 20%, the operation status of the portable electrical apparatus may be automatically shifted into a power saving mode that includes keeping at least one hardware in idle state, making some programs unable to work, keeping at least one hardware at a low performance state or a combination thereof.

When the current battery available capacity acquired by the portable electrical apparatus is not greater than 20%, for example of 19%, the current charge level of the battery may be considered in a low charge level, and the portable electrical apparatus may be shift into the power saving mode that includes one of the following operation status or a combination thereof, wherein the operation status comprises one of the following states of keeping some hardware in idle state, making some programs unable to work, or decreasing the performance of some hardware.

Accordingly, the advantages provided by the battery managing method of Embodiment IV is achieved by shifting the operation status of the portable electrical apparatus according to the comparison of a current battery available capacity of a battery (such as a Li battery) equipped by a portable electrical apparatus and a predetermined threshold value in order to make the charge-discharge frequency of the battery comply with the nature characteristic of Li, the material consisting of the battery, thus the available time of the portable electrical apparatus and the lifetime of the battery may be significantly prolonged.

Embodiment V

Figure 7A:
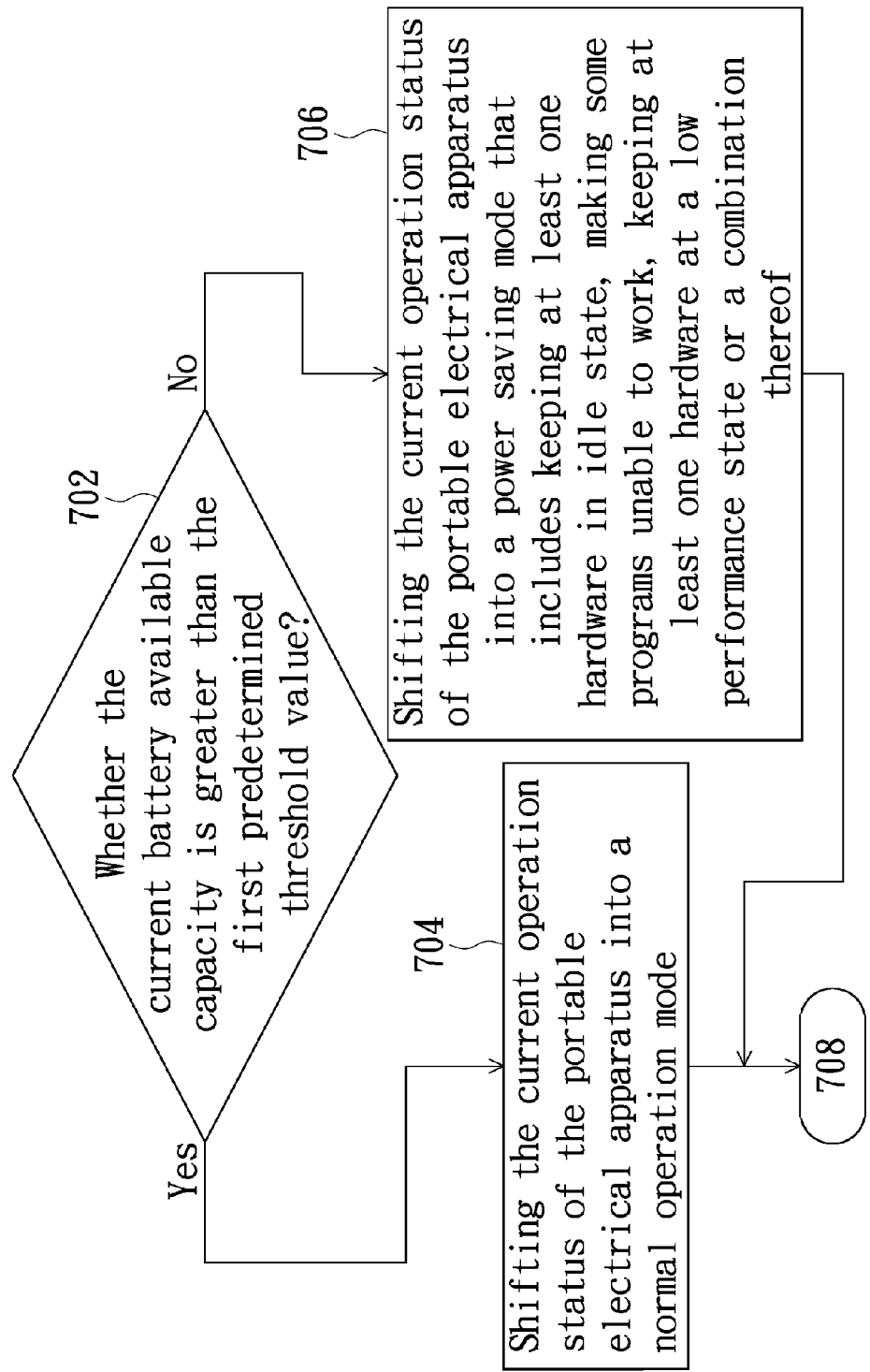
FIGS. 7A and 7B are block diagrams illustrating a battery managing method in accordance with another embodiment of the present invention.
Figure 7B:
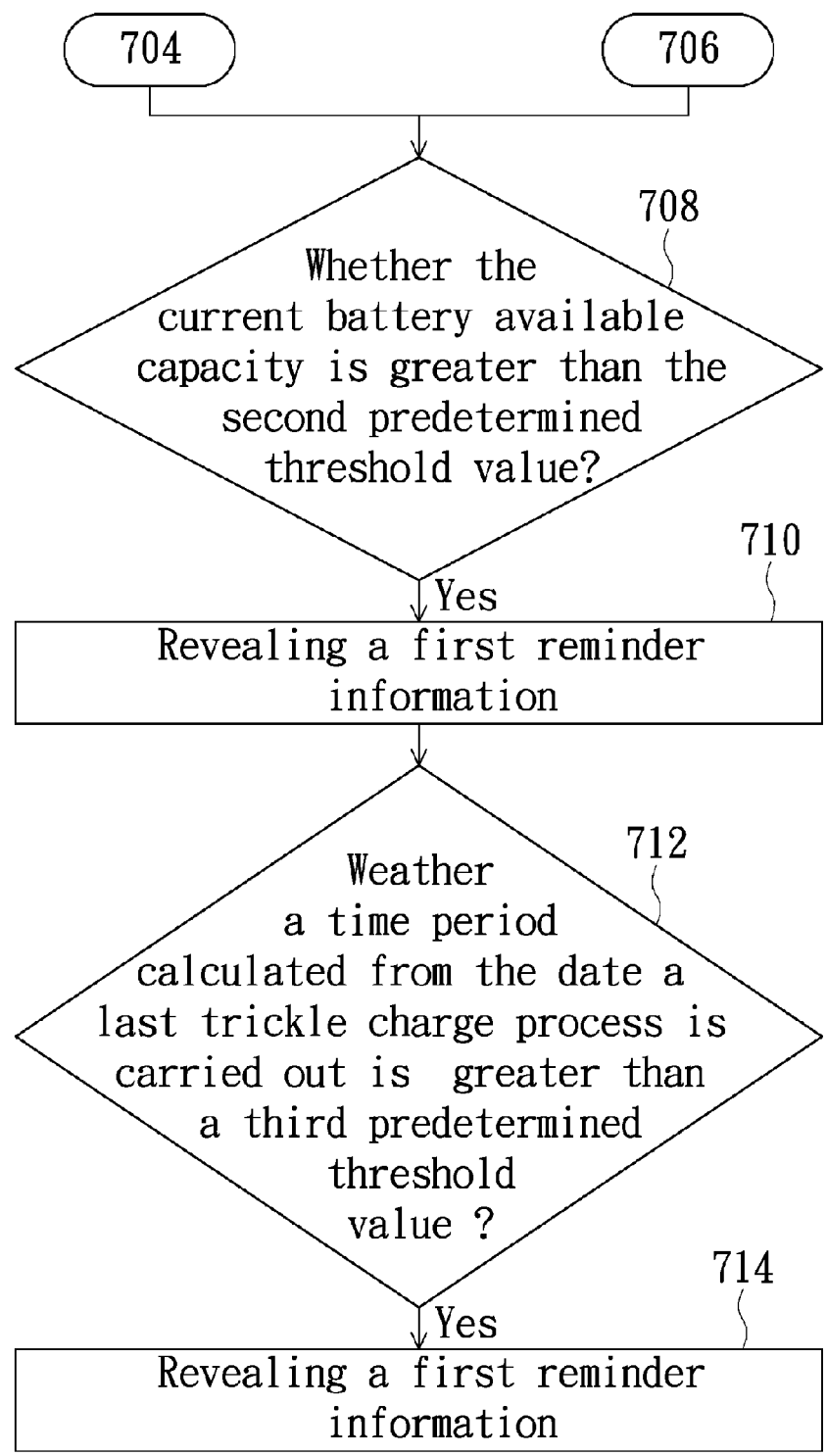

FIGS. 7A and 7B are block diagrams illustrating a battery managing method in accordance with another embodiment of the present invention. The battery managing method that is available to be applied in a portable electrical apparatus, such as a cell phone, a notebook computer, a plane computer or a PDA comprises steps as follows:

Refer to Step 702, a process for determining whether current battery available capacity is greater than the first predetermined threshold value is performed. If the answer is "Yes" the process can proceed to Step 704; and if the answer is "No" the process can otherwise proceed to Step 706.

A plurality of comparisons of the current battery available capacity and the first predetermined threshold value may be consecutively performed in real-time by the portable electrical apparatus. Otherwise, in some other embodiment, a specific time interval may be give between two of these comparisons. In some embodiments of the present invention, the current battery available capacity may be indicted as a percentage value, and the first predetermined threshold value should be also expressed as a percentage vale, for example 30%. If the current battery available capacity acquired by the portable electrical apparatus is greater than 30%, the process can proceed to Step 704; and if the current battery available capacity acquired by the portable electrical apparatus is less than 30%, the process can otherwise proceed to Step 706. Of note that the first predetermined threshold value may be varied with other percentage vale, such as 40%, 50% or 60%.

Refer to Step 704, if the current battery available capacity acquired by the portable electrical apparatus is greater than 30%, the current operation status of the portable electrical apparatus may be automatically shifted into a normal operation mode.

When the current battery available capacity acquired by the portable electrical apparatus is greater than 30%, the current charge level of the battery is considered as plenty of power to provide the portable electrical apparatus operated in a normal operation mode under which the entire hardware and programs can be operated normally. For example, while the battery with initial charge level of 2% is charged up to a current charge level that is greater than 30%, the current operation status of the portable electrical apparatus could automatically shifted from the power saving mode into the normal operation mode.

Refer to Step 706, if the current battery available capacity acquired by the portable electrical apparatus is less than 30%, the operation status of the portable electrical apparatus may be automatically shifted into a power saving mode that includes keeping at least one hardware in idle state, making at least one program unable to work, keeping at least one hardware at a low performance state or a combination thereof.

When the current battery available capacity acquired by the portable electrical apparatus is not greater than 30%, for example of 27%, the current charge level of the battery may be considered in a low charge level, and the portable electrical apparatus may be shifted into the power saving mode that includes keeping at least one hardware in idle state, making some programs unable to work, keeping at least one hardware at a low performance state or a combination thereof. In some embodiments of the present, the hardware and programs that are kept in idle or unable to work under the power saving mode may be predetermined either by a system default value or by the user's selection.

In the present embodiment, the hardware and programs that are selected to be kept in idle or unable to work under the power saving mode may be predetermined by a user's selection. In the beginning, the user may be required by a default request of the portable electrical apparatus to divide the hardware and the programs of the portable electrical apparatus into two categories of "essential" and "optional". However, it should be appreciated that hardware and the programs involved in the user's selection process may be limited, mere some predetermined hardware and programs that are excluded from the system hardware and the system software running within the portable electrical apparatus are eligible for the user's selection. For example, the hardware and applications programs that require high power consumption are eligible to be involved in the user's selection. In the some embodiments of the present invention, the predetermined hardware eligible to be involved in the user's selection may be a GPS chip, a WIFI chip or a combination thereof; and the predetermined programs eligible to be involved in the user's selection may be third-party applications, such as e-mail client applications, game, clock widget or calendar. In the present embodiment, the portable electrical apparatus may provide a function allowing the user to classify the predetermined hardware and programs into two categories of "essential" and "optional". For example, the GPS chip and the calendar application may be classified as "optional", and the WIFI chip and the clock widget application may be classified as "essential". When the operation status is shifted to the power save mode, the GPS chip and the calendar application that are classified as "optional" could be kept idle and unable to work automatically, so as to reduce the power consumption of the portable electrical apparatus.

In another embodiment, the hardware and programs that are kept in idle or unable to work under the power saving mode is predetermined by a system default value. The system default value of the portable electrical apparatus may include several operation modes to run a predetermined hardware.

For example, the predetermined hardware may be the CPU of the portable electrical apparatus, and the system default value of the portable electrical apparatus includes a first function mode and a second function mode to run the CPU, wherein the first function mode has a performance lower than that of the second function mode. In practice, the CPU has different working frequency when the CPU is operated in these two different function modes, wherein the working frequency of the CPU running in the first function mode is about 600 Mhz, and the working frequency of the CPU running in the second function mode is about 880 Mhz. When the operation status of the portable electrical apparatus is shifted to the power save mode, the CPU is shifted to run in the first function mode automatically, so as to reduce the power consumption of the portable electrical apparatus.

Refer to step 708, a process is performed to determine whether the current battery available capacity is greater than the second predetermined threshold value, wherein the second predetermined threshold value may be indicated as a percentage value ranging from 80% to 100%.

To protect the battery, when the battery is full charged, the portable electrical apparatus may remind the user to stop charging the battery. In practice, the portable electrical apparatus can determine whether the current battery available capacity of the battery is reach to the level of the second predetermined threshold value indicating that the battery is full charged, wherein the second predetermined threshold value may be 99%.

Refer to Step 710, when the current battery available capacity is greater than the second predetermined threshold value, a first reminder information is revealed.

When the current battery available capacity of the battery reaches to the level of the second predetermined threshold value, e.g. 99%, the first reminder information may be provided by the portable electrical apparatus, wherein the first reminder information may be a message used to remind the user to stop charging the battery. Practically, the first reminder information may be provided in the form of written words, voice, flash, a dialog box, vibration or a combination thereof. For example the first reminder information may consist of a combination of a dialog box expressing that "Battery is Full Charged, Please Stop Charging the Battery" and a short rings.

Refer to step 712, a process is performed to determining weather a time period calculated from the date a last trickle charge process is carried out is greater than a third predetermined threshold value.

To maintain the battery performance, especially that of a Li battery, the portable electrical apparatus may remind and suggest the user to carry a trickle charging process after a long operation interval. Typically a battery charging process may be divided into two stages. In the first stage, a high current charge may quickly fill the battery to about 80 percent, and the other 20 percent is filled at the second stage. However, in order to repair the battery charging capacity degradation, a trickle charging process is performed after the first stage and the second stage, by which the fully charged battery is recharged with a extreme low current and under no-load at a rate equal to its self-discharge rate, thus enabling the battery to remain at its fully charged level. Typically, a long operation interval is given between two trickle charging processes, and the third predetermined threshold value is a time period provided by the portable electrical apparatus to determine weather a time period calculated from the date a last trickle charge process is carried out is greater than a predetermined time interval, such as one month.

Refer to Step 714, when the time period calculated from the date a last trickle charge process is carried out is greater than the third predetermined threshold value, a second reminder information is revealed.

When the time period calculated from the date a last trickle charge process is carried out is greater than the third predetermined threshold value, e.g. one month, the second reminder information may be provided by the portable electrical apparatus, wherein the second reminder information may be a message used to remind the user to perfume a trickle charging process. Practically, the second reminder information may be provided in the form of written words, voice, flash, a dialog box, vibration or a combination thereof. For example the second reminder information may consist of a combination of a dialog box expressing that "Battery Maintain is Needed, Performing a Battery Maintain or Not?" and a short rings.

Accordingly, the advantages provided by the battery managing method of Embodiment V is achieved by shifting the operation status of the portable electrical apparatus according to the comparison of a current battery available capacity of a battery (such as a Li battery) equipped by a portable electrical apparatus and a predetermined threshold value to make the charge-discharge frequency of the battery comply with the nature characteristic of Li, the material consisting of the battery, thus the available time of the portable electrical apparatus and the lifetime of the battery may be significantly prolonged. In addition, when the battery is full charge or a battery maintain is need, reminder information may be provided to remind the user stopping charging the battery or proceeding a trickle charging process, so as to protect the battery from being overcharged and enable the battery remaining at its fully charged level. Therefore, the lifetime of the battery could be further prolonged.

Embodiment VI

Figure 8:
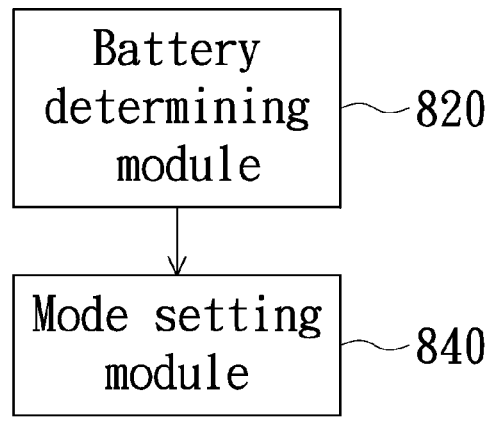
FIG. 8 is a block diagram illustrating an apparatus for performing the battery managing method depicted in FIG. 6 in accordance with one embodiment of the present invention.

FIG. 8 is a block diagram illustrating an apparatus for performing the battery managing method depicted in FIG. 6 in accordance with one embodiment of the present invention. The apparatus for performing the battery managing method (thereinafter referred as a battery managing apparatus) is available to be applied in a portable electrical apparatus, such as a cell phone, a notebook computer, a plane computer or a PDA, and the battery managing apparatus comprises a battery determining module 820 and a mode setting module 840.

The battery determining module 820 is used to determine whether the current battery available capacity is greater than a first predetermined threshold value.

The mode setting module 840 is used to shift the current operation status of the portable electrical apparatus into a normal operation mode, while the current battery available capacity is greater than the first predetermined threshold value.

The mode setting module 840 is further used to shift the current operation status of the portable electrical apparatus into a power saving mode that includes keeping at least one hardware in idle state, making at least one program unable to work, keeping at least one hardware at a low performance state or a combination thereof, while the current battery available capacity is not greater than the first predetermined threshold value.

Figure 9:
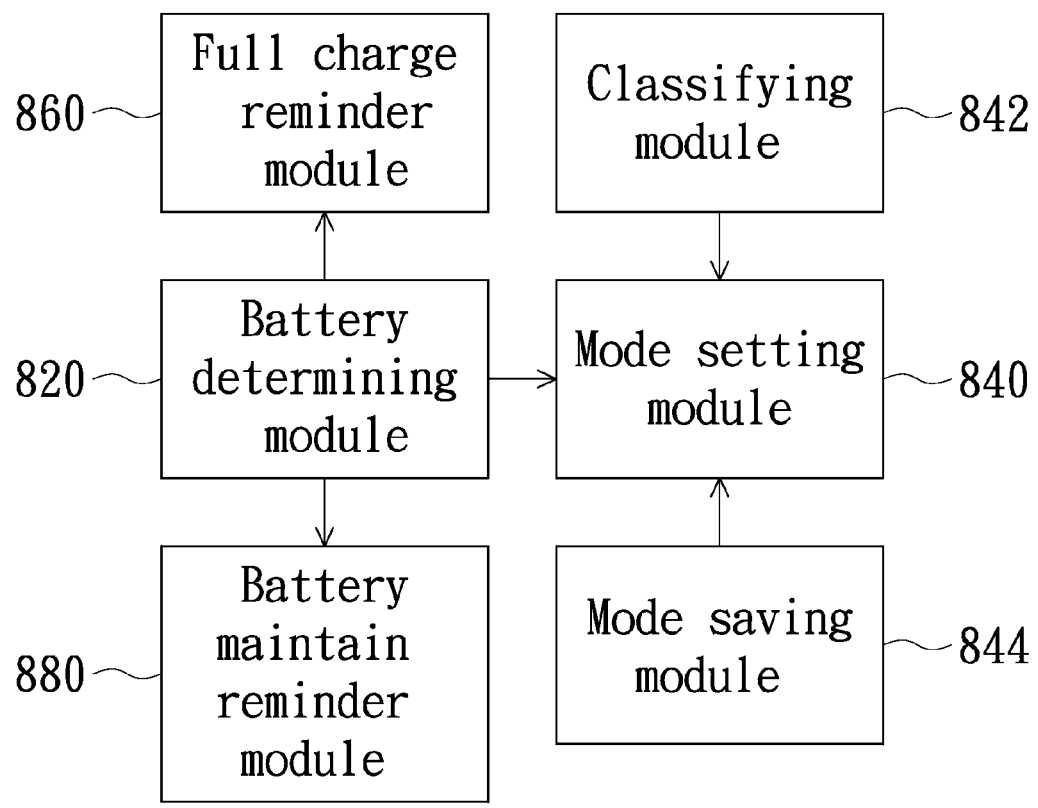
FIG. 9 is a block diagram illustrating an apparatus for performing the battery managing method depicted in FIG. 6 in accordance with another embodiment of the present invention.

FIG. 9 is a block diagram illustrating an apparatus for performing the battery managing method depicted in FIG. 6 in accordance with another embodiment of the present invention, wherein the structure of the battery managing apparatus of FIG. 9 is similar to that of the apparatus for performing the battery managing method depicted in FIG. 8 except that the battery managing apparatus of FIG. 9 further comprises a classifying module 842.

In the present embodiment, the classifying module 842 is used to classify at least one predetermined hardware and program into two categories of "essential" and "optional". While the current battery available capacity is not greater than the first predetermined threshold value, the mode setting module 840 is used to shift the current operation status of the portable electrical apparatus into a into a power saving mode. In the case, the predetermined hardware and programs that are classified as "optional" could be kept idle and unable to work automatically.

The battery managing apparatus further comprises a mode saving module 844 (see FIG. 9) used to save a first function mode and a second function mode of a predetermined hardware, wherein the first function mode has a performance lower than that of the second function mode. While the current battery available capacity is not greater than the first predetermined threshold value, the mode setting module 840 is used to shift the current operation status of the portable electrical apparatus into a into a power saving mode. In the case, the predetermined hardware is shifted to run in the first function mode automatically.

The battery managing apparatus further comprises a full charge reminder module 860. As shown in FIG. 9, the battery determining module 820 can be further used to determine whether the current battery available capacity of the battery reaches to a second predetermined threshold value during a battery charging process. When the current battery available capacity reaches to the second predetermined threshold value, a first reminder information is provided by the full charge reminder module 860, wherein the second predetermined threshold value may be indicated as a percentage value ranging from 80% to 100%.

The battery managing apparatus further comprises a battery maintain reminder module 880. As shown in FIG. 9, the battery determining module 820 can be further used to determine whether a time period is greater than a third predetermined threshold value, wherein the time period is calculated from the date a last trickle charge process is carried out. When the time period is greater than the third predetermined threshold value, the battery maintain reminder module 880 is used to provide a second reminder information.

Accordingly, the advantages provided by the battery managing method of Embodiment VI is achieved by shifting the operation status of the portable electrical apparatus according to the comparison of a current battery available capacity of a battery (such as a Li battery) equipped by a portable electrical apparatus and a predetermined threshold value to make the charge-discharge frequency of the battery comply with the nature characteristic of Li, the material consisting of the battery, thus the available time of the portable electrical apparatus and the lifetime of the battery may be significantly prolonged. In addition, when the battery is full charge or a battery maintain is need, reminder information may be provided to remind the user stopping charging the battery or proceeding a trickle charging process, so as to protect the battery from being overcharged and enable the battery remaining at its fully charged level. Therefore, the lifetime of the battery could be further prolonged.

It should be appreciated that the aforementioned embodiments are presented herein just for purpose of illustration and description only. It is not intended to be exhaustive or to be limited to the precise form disclosed. Thus the modules described in the aforementioned embodiments can be rearranged and modified to achieve the same functions without deviating the spirit of the present invention. However, since these various rearranged and modifications are belong to a general spirit and inventive concept with the aforementioned embodiments, thus may not be redundantly described Of note that the ordinal number of the above embodiments are just illustrative, instead of expressing the priority or preference thereof.

While the invention has been described in terms of what is presently considered to be the most practical and preferred embodiments, thus those ordinarily skilled in the art will chose suitable device or call suitable application programs to achieve above objects and advantages of the present invention by referencing these embodiments. Wherein the application programs can be any suitable software stored in a storage medium, such as a red-only memory device, a compact disc or an optical discs.

It is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for monitoring and managing battery charge level, the method comprising:
    acquiring a current charge level of a battery equipped in the electrical apparatus;
    directing a coefficient of current battery power consumption in accordance with a user's operation habit concluded from a power consumption history of the battery; and
    estimating a battery remaining time of the battery in accordance with the current charge level of the battery and the coefficient of current battery power consumption under the current operating status of the electrical apparatus; wherein
    the process for estimating the battery remaining time comprises steps of:
    estimating a current battery available capacity in accordance with the current charge level of the battery and the coefficient of current battery power consumption;
    acquiring a current operating status of the electrical apparatus at least including an idle state, a phone call state, an internet connection state or a text display state; and
    acquiring a current battery power consumption that indicates the amount of battery power consumed by the electrical apparatus in a certain operating interval under the current operating status; and
    estimating the current battery remaining time in accordance with the current battery available capacity and the current battery power consumption under a certain operating status of the electrical apparatus;
    wherein the process for acquiring the current operating status of the electrical apparatus comprises a step of applying a predetermined call state interface to acquire the current operating status of the electrical apparatus.

2. The method according to claim 1, wherein the process for acquiring the current charge level comprises a step of applying an application programming interface (API) corresponding to the battery to acquire the current charge level of the battery.

3. The method according to claim 1, wherein the process for directing the coefficient of current battery power consumption comprises a step of retrieving the coefficient of current battery power consumption from a database showing a correlation between a predetermined operation habit and its corresponding coefficient in power consumption in accordance with the current user's operation habit.

4. The method according to claim 1, wherein the process for acquiring the current battery power consumption comprises a step of retrieving the current battery power consumption from a database showing a correlation between a predetermined operating status and its corresponding battery power consumption in accordance with the current operating status.

5. The method according to claim 1, further comprising:
determining whether the current battery available capacity is greater than a first predetermined threshold value;
shifting the current operation status into a normal operation mode, if the current battery available capacity is greater than the first predetermined threshold value; and
shifting the current operation status into a power saving mode that includes keeping at least one hardware in idle state, making at least one program unable to work, keeping at least one hardware at a low performance state or a combination thereof, if the current battery available capacity is not greater than the first predetermined threshold value.

6. An apparatus for monitoring and managing battery charge level comprising:
a first information acquiring module, used to acquire a current charge level of a battery equipped in an electrical apparatus;
a monitoring module, used to monitoring a power consumption history of the battery, so as to conclude a user's operation habit at least comprising historical information about battery discharge frequency or time interval of battery discharge;
a second information acquiring module, used to direct a coefficient of current battery power consumption in accordance with the user's operation habit; and
a calculating module, used to calculate a battery remaining time of the battery in accordance with the current charge level and the coefficient of current battery power consumption under the current operating status of the electrical apparatus; wherein the calculating module comprises:
a first calculating unit, used to estimate a current battery available capacity in accordance with the current charge level of the battery and the coefficient of current battery power consumption;
a first information acquiring unit, used to acquire a current operating status of the electrical apparatus including an idle state, a phone call state, an internet connection state or a text display state;
a second information acquiring unit, used to acquire a current battery power consumption indicating the amount of battery power consumed by the electrical apparatus in a certain operating interval under the current operating status; and
a second calculating unit, used to estimate a current battery remaining time in accordance with the current battery available capacity and the current battery power consumption;
wherein the first information acquiring module is used to apply a predetermined call state interface to acquire the current operating status of the electrical apparatus.

7. The apparatus according to claim 6, wherein the first information acquiring module is used to apply an API corresponding to the battery to acquire the current charge level of the battery.

8. The apparatus according to claim 6, wherein the second information acquiring module is used to direct the coefficient of current battery power consumption by retrieving a database showing a correlation between a predetermined operation habit and its corresponding coefficient in power consumption in accordance with the user's operation habit.

9. The apparatus according to claim 6, wherein the second information acquiring unit is used to retrieve the current battery power consumption from a database showing a correlation between a predetermined operating status and its corresponding battery power consumption in accordance with the current operating status of the electrical apparatus in order to acquire the current battery power consumption.

10. The apparatus according to claim 6, further comprising:
a battery determining module, used to determine whether the current battery available capacity is greater than a first predetermined threshold value; and
a mode setting module, used to shift the current operation status into a normal operation mode, while the current battery available capacity is greater than the first predetermined threshold value; and used to shift the current operation status into a power saving mode including of keeping at least one hardware in idle state, making at least one program unable to work, keeping at least one hardware at a low performance state or a combination thereof, while the current battery available capacity is not greater than the first predetermined threshold value.

11. A battery managing method, comprising:
determining whether a current battery available capacity of a battery equipped in an electrical apparatus is greater than a first predetermined threshold value;
shifting a current operation status of the electrical apparatus into a normal operation mode, if the current battery available capacity is greater than the first predetermined threshold value;
shifting the current operation status into a power saving mode that includes keeping at least one hardware in idle state, making at least one program unable to work, keeping at least one hardware at a low performance state or a combination thereof, if the current battery available capacity is not greater than the first predetermined threshold value;
the method further comprising steps of: determining whether the current battery available capacity reaches to the second predetermined threshold value; and
revealing a first reminder information, when the current battery available capacity reaches to the second predetermined threshold value,
wherein the second predetermined threshold value is indicated as a percentage value ranging from 80% to 100%,
determining whether a time period calculated from a last trickle charge process is carried out is greater than a third predetermined threshold value; and
revealing a second reminder information, when the time period is greater than the third predetermined threshold value.

12. The battery managing method according to claim 11, before the process for determining whether the current battery available capacity is greater than the first predetermined threshold value, further comprising steps of:
classifying at least one predetermined hardware or program of the electrical apparatus into an essential category and an optional category;
whereby when the current operation status is shifted into the power saving mode the predetermined hardware that is classified in the optional category can be kept in idle state; and the predetermined program that is classified in the optional category can be set as unable to work.

13. The battery managing method according to claim 11, before the process for determining whether the current battery available capacity is greater than the first predetermined threshold value, further comprising steps of:

saving a system default value to allow a predetermined hardware of the electrical apparatus running either in a first function mode or a second function mode, wherein the first function mode has a performance lower than that of the second function mode;

thus when the current operation status is shifted into the power saving mode, the predetermined hardware can run in the first function mode.

14. A battery managing apparatus, comprising:

a battery determining module, used to determine whether a current battery available capacity of a battery equipped in an electrical apparatus is greater than a first predetermined threshold value;

a mode setting module, used to either shift a current operation status of the electrical apparatus into a normal operation mode, while the current battery available capacity is greater than the first predetermined threshold value, or shift the current operation status into a power saving mode including keeping at least one hardware in idle state, making at least one programs unable to work, keeping at least one hardware at a low performance state or a combination thereof, while the current battery available capacity is not greater than the first predetermined threshold value; and a full charge reminder module used to provide a first reminder information, when the battery determining module determines that the current battery available capacity reaches to the second predetermined threshold value, wherein the second predetermined threshold value is indicated as a percentage value ranging from 80% to 100%, further comprising a battery maintain reminder module used to provide a second reminder information, when a time period calculated from a last trickle charge process is carried out is greater than a third predetermined threshold value.

15. The battery managing apparatus according to claim 14, further comprising a classifying module used to classify at least one predetermined hardware or program into an essential category and an optional category;

when the current operation status is shifted into a power saving mode the predetermined hardware that is classified in the optional category can be kept in idle state; and the predetermined program that is classified in the optional category can be set as unable to work.

16. The battery managing apparatus according to claim 14, further comprising a mode saving module used to save a system default value allowing a predetermined hardware of the electrical apparatus running either in a first function mode or a second function mode, wherein the first function mode has a performance lower than that of the second function mode;

when the current operation status is shifted into the power saving mode the predetermined hardware can run in the first function mode.

\* \* \* \* \*